United States Patent [19]

Uchida et al.

[11] Patent Number: 5,410,411
[45] Date of Patent: Apr. 25, 1995

[54] METHOD OF AND APPARATUS FOR FORMING MULTI-LAYER FILM

[75] Inventors: Shinji Uchida, Neyagawa; Tsuguhiro Korenaga, Kadoma; Akito Sawada, Osaka; Hideo Kurokawa, Katano, all of Japan

[73] Assignee: Matsushita Electric Industrial Co., Ltd., Osaka, Japan

[21] Appl. No.: 3,807

[22] Filed: Jan. 13, 1993

[30] Foreign Application Priority Data

Jan. 17, 1992 [JP] Japan .................. 4-006271

[51] Int. Cl.⁶ .............................. G01B 11/02
[52] U.S. Cl. .................. 356/381; 356/382; 356/357; 250/560
[58] Field of Search .......... 356/381, 382, 73, 445, 356/355, 357, 426; 250/560, 559; 156/601, 612

[56] References Cited

U.S. PATENT DOCUMENTS

| | | | |
|---|---|---|---|
| 3,869,211 | 3/1975 | Watanabe et al. | 356/381 |
| 3,892,490 | 7/1975 | Uetsuki et al. | 356/382 |
| 4,582,431 | 4/1986 | Cole | 356/382 |

FOREIGN PATENT DOCUMENTS 2750421 5/1979 Germany.

OTHER PUBLICATIONS

Applied Optics, vol. 18, No. 12, Jun. 1979, New York, pp. 1978-1982, C. Holm, "Optical thin film production with continuous reoptimization of layer thickness", pp. 1978-1979.

Primary Examiner—Hoa Q. Pham
Attorney, Agent, or Firm—Wenderoth, Lind & Ponack

[57] ABSTRACT

A method of and an apparatus for forming a multi-layer film, includes: a thickness control device for controlling an optical film thickness or a thickness of each of the layers of the multi-layer film; a multi-layer film monitoring substrate on which the multi-layer film is formed; a measurement device for measuring the optical characteristics of the multi-layer film formed on the multi-layer film monitoring substrate; and a processing device which processes the results obtained by the measurement device so as to feed the processed results back to the thickness control device.

7 Claims, 15 Drawing Sheets

METHOD OF AND APPARATUS FOR FORMING MULTI-LAYER FILM

BACKGROUND OF THE INVENTION

The present invention relates to a method of and an apparatus for forming a multi-layer film for use in an optical device, etc.

Conventionally, monochromatic photometry or bi-colored photometry has been employed for forming a multi-layer film. A known multi-layer film forming apparatus based on monochromatic photometry is described with reference to FIG. 1. In FIG. 1, deposition material 183 is heated for its fusion by an electron beam gun 182 so as to be evaporated. The electron beam gun 182 is provided in a vacuum chamber 181 which is held in a high vacuum state by an exhaust pump 180. Evaporated particles 184 of the deposition material 183 proceed to a substrate 186 mounted on a substrate holder 185 so as to form a thin film on the substrate 186. Meanwhile, an optical film thickness monitoring substrate 188 for monitoring an optical thickness of a thin film is provided above an aperture 187 of the substrate holder 185. The evaporated particles 184 which have passed through the aperture 187 of the substrate holder 185 reach the thickness monitoring substrate 188 so as to form a thin film on the thickness monitoring substrate 188.

A bundle of rays of a specific wavelength emitted from a light source 189 reaches the thin film formed on the thickness monitoring substrate 188 and is reflected by the thin film formed on the thickness monitoring substrate 188 so as to be detected by a detector 190. The amount of reflected light from the thin film formed on the thickness monitoring substrate 188 varies according to the thickness of the thin film. Therefore, when the amount of reflected light from the thin film formed on the thickness monitoring substrate 188 has reached a predetermined value, a shutter 191 is closed so as to terminate deposition of the deposition material 183 on the substrate 186 such that the formation of the thin film of a first layer on the substrate 186 is completed. As a result, the required thickness accuracy of the thin film on the substrate 186 is achieved.

Subsequently, the deposition material 183 is replaced by another deposition material 183 and the thickness monitoring substrate 188 is also replaced by a new substrate. In the same manner as the first layer, the deposition material 183 is heated for its fusion by the electron beam gun 182 so as to be evaporated such that a thin film of a second layer is formed on the substrate 186. By repeating such procedures a plurality of times, a multi-layer film is formed.

However, the above mentioned known method has the following drawbacks. Namely, since the thickness of the thin film formed on the substrate is determined in accordance with the amount of light reflected from or transmitted through the thin film formed on the optical film thickness monitoring substrate, it is extremely difficult to perform a highly accurate control of the thickness of the thin film formed on the substrate to within a 0.5% accuracy.

Meanwhile, the amount of light reflected from or transmitted through the thin film formed on the optical film thickness monitoring substrate varies periodically according to an optical film thickness of the thin film, which is equal to a product of a refractive index of the thin film multiplied by a thickness of the thin film. Thus, by employing this periodicity, the optical film thickness of the thin film can be controlled comparatively easily. However, when the refractive index of the thin film has changed due to minute changes of thin film forming conditions such as degree of vacuum, temperature, etc., the thickness of the thin film varies even if the optical thickness of the thin film is constant, so that it is difficult to perform highly accurate control of the thickness of the thin film.

Since specifications required of recent optical devices are severe, the conventional accuracy in optical film thickness of the thin film is insufficient for the specifications and thus, there is a keen demand for a more accurate method of controlling the thickness of the thin film.

Meanwhile, even if only one layer has an improper thickness for some reason or other in a multi-layer film having several tens of layers, a batch consisting of all of the products employing the multi-layer film become defective, which constitute an obstacle to mass production of the products.

SUMMARY OF THE INVENTION

Accordingly, an essential object of the present invention is to provide a method and an apparatus for forming a multi-layer film, which eliminate the above mentioned inconveniences inherent in conventional methods and apparatuses.

In order to accomplish this object of the present invention, a method of forming a multi-layer film having N layers (N=natural number), according to the present invention comprises the steps of: forming the multi-layer film up to L layers (L=natural number<N) while controlling thicknesses of the L layers to respective preset values by a thickness control means; measuring optical characteristics of the L layers formed on a multi-layer film monitoring substrate so as to determine a deviation of the measured optical characteristics of the L layers from target optical characteristics of the L layers; performing a computation in which thicknesses of (L+1)-th to N-th layers of the multi-layer film are shifted from respective predetermined values such that the deviation of the measured optical characteristics of the L layers from the target optical characteristics of the L layers is reduced.

In addition to a conventional control means for controlling a thickness of each of layers of the multi-layer film, the apparatus of the present invention includes a measurement means for measuring the optical characteristics of the multi-layer film. Thus, in the course of formation of the multi-layer film, the deviation of the measured optical characteristics of the L layers from the target optical characteristics of the L layers is detected and is fed back to the film thickness control.

Therefore, in accordance with the present invention, the multi-layer film having a higher accuracy and performance than prior art multi-layer films can be obtained.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
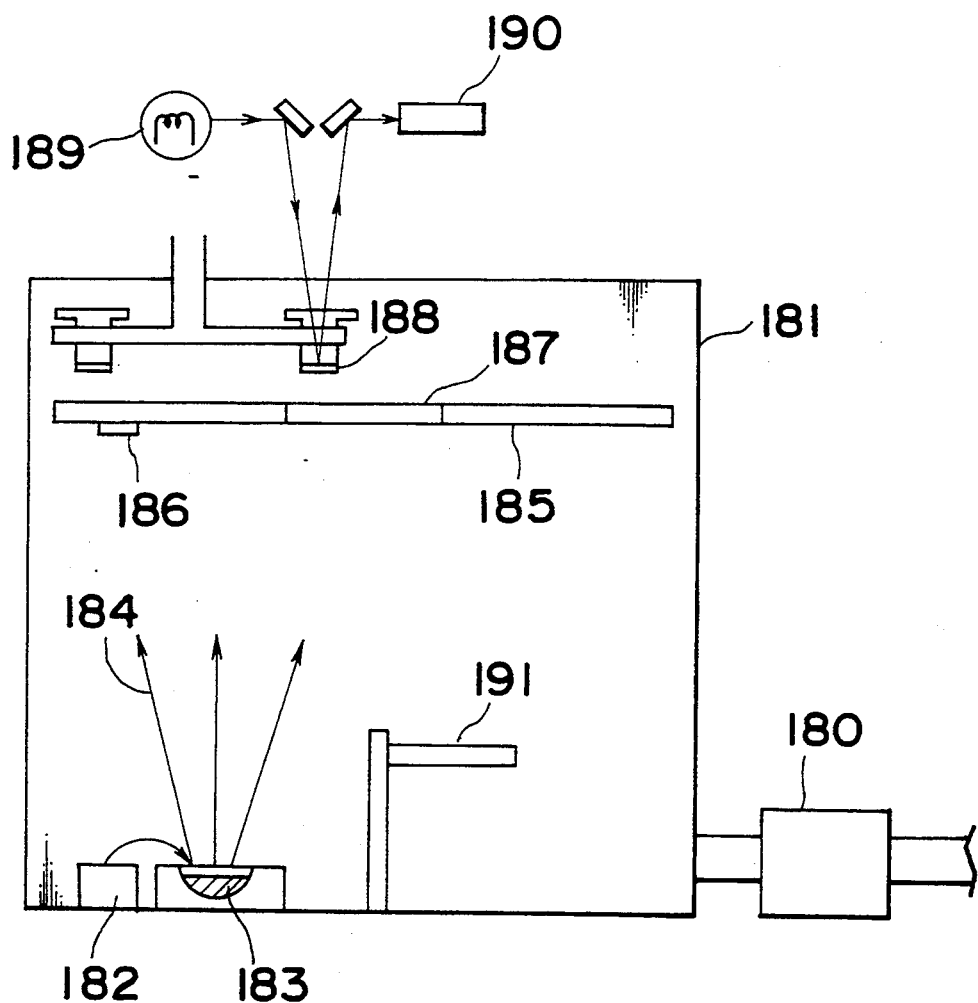
FIG. 1 is a schematic view of a prior art multi-layer film forming apparatus (already referred to)
Figure 2:
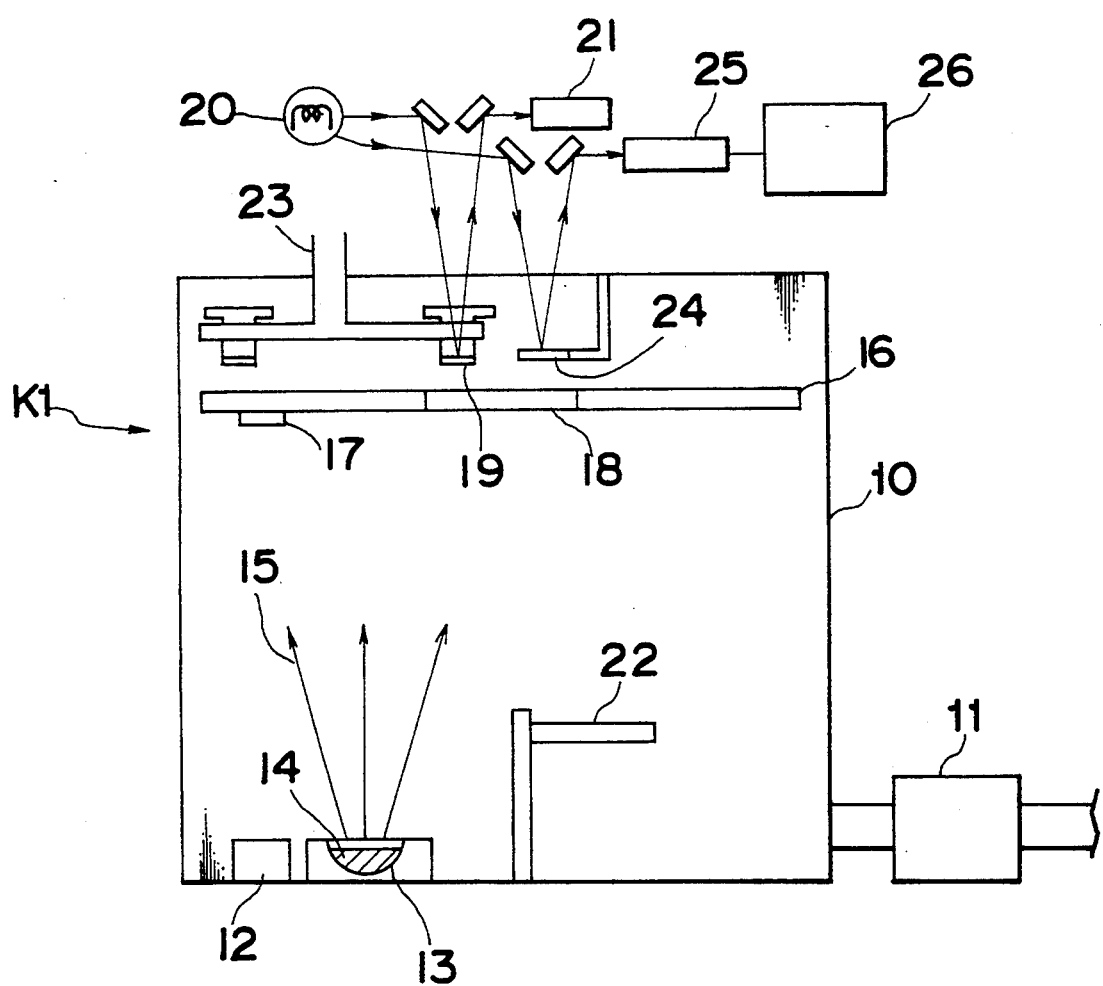
FIG. 2 is a schematic view of a multi-layer film forming apparatus according to a first embodiment of the present invention.

Referring now to the drawings, there is shown in FIG. 2, a multi-layer film forming apparatus K1 according to a first embodiment of the present invention. The apparatus K1 is based on monochromatic photometry. In FIG. 2, a multi-layer film having 19 layers is formed by the apparatus K1. The apparatus K1 is characterized by a multi-layer film monitoring substrate 24 for measuring optical characteristics of a multi-layer film. Initially, the interior of a vacuum chamber 10 is held in high vacuum state by an exhaust pump 11. Deposition material 14 in a crucible 13 is heated for its fusion by an electron beam gun 12 so as to be evaporated. For example, titanium dioxide ($TiO_2$) is employed as the deposition material 14. Thus, evaporated particles 15 of the deposition material 14 proceed to a substrate 17 mounted on a lower face of a substrate holder 16 so as to form a thin film on the substrate 17. At this time, the evaporated particles 15 which have passed through an aperture 18 of the substrate holder 16, reach an optical film thickness monitoring substrate 19 so as to form a thin film on the thickness monitoring substrate 19. Likewise, the evaporated particles 15 reach the film monitoring substrate 24 so as to form a thin film on the film monitoring substrate 24.

A bundle of rays of a specific wavelength is emitted from a light source 20 so as to be irradiated to the thickness monitoring substrate 19 and is reflected to a detector 21. The amount of reflected light from the thickness monitoring substrate 19 varies according to refractive index and thickness of the thin film formed on the thickness monitoring substrate 19. When the amount of reflected light from the thickness monitoring substrate 19 has reached a predetermined value, a shutter 22 is closed so as to terminate deposition of the deposition material 14 on the substrate 17 such that the formation of the thin film of a first layer on the substrate 17 is completed.

Upon completion of the thin film of the first layer on the substrate 17, the deposition material 14 in the crucible 13 is replaced by silicon dioxide ($SiO_2$) and the thickness monitoring substrate 19 is also replaced by a new substrate by using an exchange mechanism 23. The deposition material 14 is heated for its fusion by the electron beam gun 12 so as to be scattered as evaporated particles 15 such that a thin film of a second layer is formed on the substrate 17 by the evaporated particles 15. In the same manner as the thin film of the first layer, the evaporated particles 15 also proceed to the thickness monitoring substrate 19 so as to form a thin film on the thickness monitoring substrate 19. By measuring reflected light from the thickness monitoring substrate 19, the thin film of the second layer having a predetermined thickness can be obtained.

Figure 3:
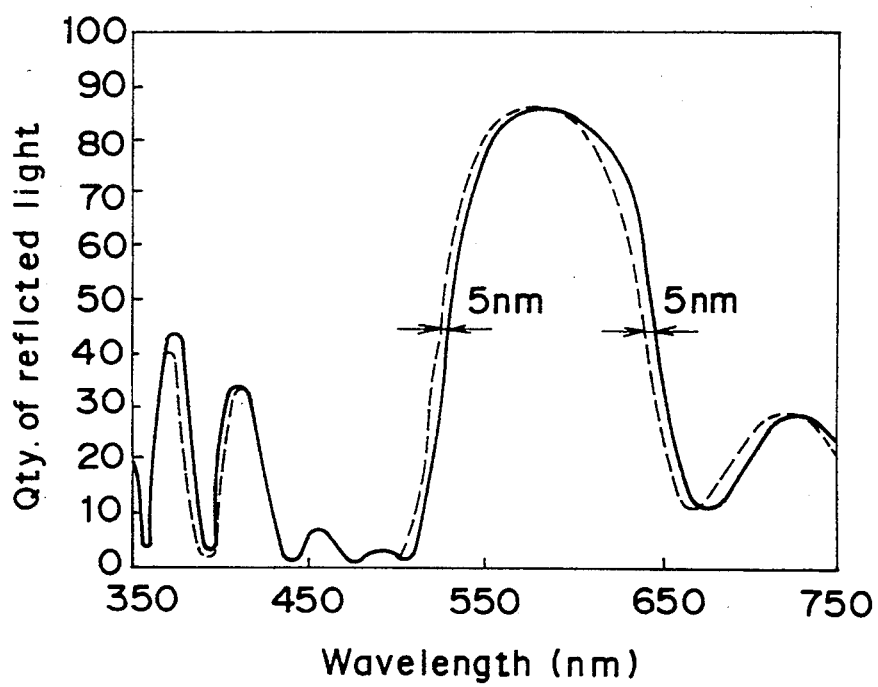
FIG. 3 is a graph showing optical characteristics of a multi-layer film whose optical characteristics deviate from target optical characteristics.

In contrast with the thickness monitoring substrate 19, the film monitoring substrate 24 is held at a specific position after formation of the thin film of the first layer. Therefore, the thin film of the second layer is formed on the thin film of the first layer on the film monitoring substrate 24 and thus, a multi-layer film having two layers is formed on the film monitoring substrate 24. For example, when a bundle of rays emitted from the light source 20 is caused to be incident upon the film monitoring substrate 24 and a reflected light from the film monitoring substrate 24 is measured by an optical characteristics evaluator 25, the spectral characteristics of this multi-layer film can be determined. When a multi-layer film having, e.g., 10 layers has been formed on the film monitoring substrate 24 by repeating the above described operation 10 times, the spectral characteristics of the multi-layer film are obtained as shown by the broken line of FIG. 3. In the graph of FIG. 3, the abscissa represents the wavelength expressed in nm, while the ordinate represents the amount of reflected light expressed in an arbitrary units. The spectral characteristics of the multi-layer film illustrated by the broken line in FIG. 3 have a maximum the amount of reflected light at a wavelength of about 570 nm.

Generally, such a multi-layer film is called a "dichroic film" and exhibits various colors by arbitrarily setting a wavelength giving a maximum value of the amount of reflected light, etc. It is said that accurate control of the position of such a wavelength is vital to the dichroic film. However, the refractive index and thickness of the laminated thin films vary according to errors in control of the thickness of the thin film and minute changes in the deposition conditions, etc. Accordingly, the optical characteristics of the multi-layer-film usually deviate from the target optical characteristics each time the multi-layer film is formed. Then, when a multi-layer film having 10 layers has been formed under the same film forming conditions as those of the multi-layer film of the broken line of FIG. 3 so as to obtain the same optical characteristics as the optical characteristics of the broken line of FIG. 3 by setting the optical characteristics of the broken line of FIG. 3 as the target optical characteristics, the optical characteristics of the multi-layer film are obtained as shown by the solid line of FIG. 3. Therefore, the optical characteristics of the former multi-layer film deviate from those of the latter multi-layer film as shown by the broken line and the solid line of FIG. 3. When the amount of deviation between the optical characteristics of the former multi-layer film and those of the latter multi-layer film is measured by a wavelength corresponding to one half of the maximum quantity of reflected light, which is most important for the dichroic film generally, namely, one half-wavelength, the optical characteristics of the solid line of FIG. 3 deviate by about 5 nm from the target optical characteristics of the broken line of FIG. 3 rightwards.

Therefore, if the formation of a thin film is continued merely based on the conventional control of a single-layer film, the optical characteristics of the final multi-layer film having 19 layers will further deviate from target optical characteristics, thereby resulting in their deterioration.

Figure 4:
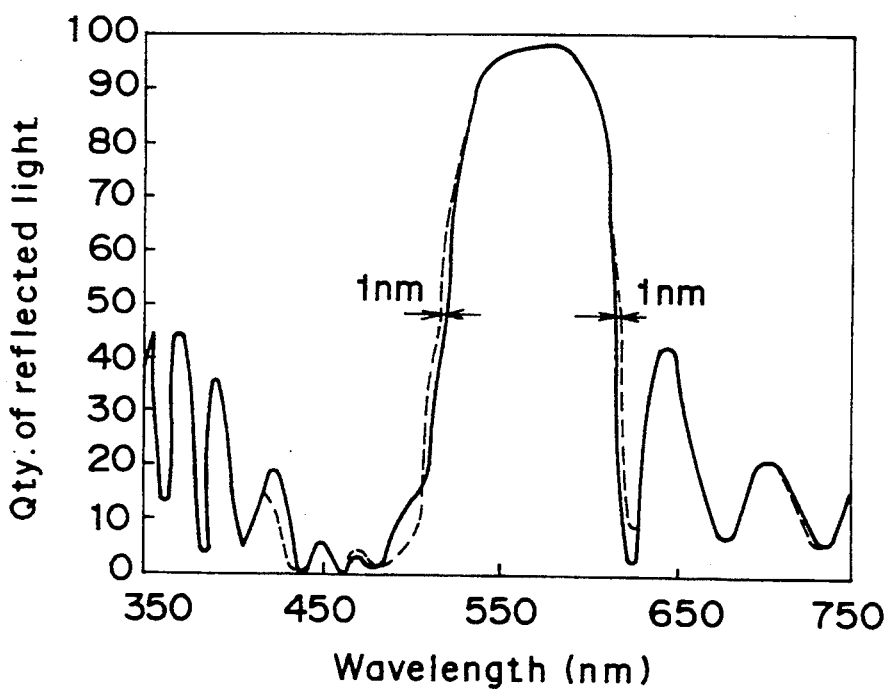
FIG. 4 is a graph showing optical characteristics of a multi-layer film produced by the multi-layer film forming apparatus of FIG. 2, in which the deviation of optical characteristics of the multi-layer film from the target optical characteristics is corrected.

Therefore, in the present invention, at stages prior to the formation of the final multi-layer having 19 layers, the spectral characteristics of a multi-layer film are measured so as to obtain their deviation from the target spectral characteristics and the refractive index and thickness of the subsequent multi-layer film are corrected such that the spectral characteristics of the subsequent multi-layer film are approximately to the target spectral characteristics of the subsequent multi-layer film. One example is given in which correction operation is performed from a multi-layer film having 10 layers. Initially, when the multi-layer film having 10 layers has been formed on the film monitoring substrate 24, the amount of reflected light from the film monitoring substrate 24 is measured for each wavelength by the optical characteristics evaluator 25 and its deviation from a target value of the multi-layer film having 10 layers is obtained by a computer 26. Then, by performing a computation in which refractive index and thickness of each of the thin films of the 11th layer to 19th layers are respectively shifted from preset values such that amount of the deviation from the target value is reduced, and the refractive index and thickness of the thin film of the 11th to 19th layers are determined. By setting the thus obtained refractive index and thickness of the thin film of the 11th layer as target values of the thin film of the 11th layer, the thin film of the 11th layer is formed on the 10-layer film on the film monitoring substrate 24. Such an operation is repeated until completion of the formation of the 19-layer film and thus, the optical characteristics of the 19-layer film are obtained as shown in FIG. 4. In FIG. 4, the solid line denotes the experimental value, while the broken line denotes the target value. It is seen from FIG. 4 that the experimental optical characteristics (solid line) of the 19-layer film substantially coincide with the target optical characteristics of the broken line at a half-wavelength of not more than about 1 nm, so that a remarkably highly accurate and excellent optical characteristics of the multi-layer film are obtained.

In this embodiment, the amount of reflected light from the film monitoring substrate 24 is measured. However, it may be also so arranged that the amount of light transmitted through the film monitoring substrate 24 is measured.

In addition to the conventional function of controlling a single-layer film, the functions of monitoring and correcting the optical characteristics of the multi-layer film are provided in the present invention. Therefore, in the present invention, since the deviation of refractive index and thickness of each layer from their target values can be corrected, a highly accurate multi-layer film which it has been hitherto impossible to obtain can be formed quite easily, which is advantageous for practical use.

Meanwhile, in this embodiment, the optical characteristics of the multi-layer film are corrected from the thin film of the 10th layer. However, the that correction of the optical characteristics may be performed from the thin film of the first layer.

Furthermore, in this embodiment, in order to control the thickness of the single-layer film, the device based on monochromatic photometry is used but may be replaced by an atomic absorption type film thickness monitor or a crystal type film thickness monitor. By using the multi-layer film forming method of the present invention, an excellent multi-layer film can be obtained.

Figure 5:
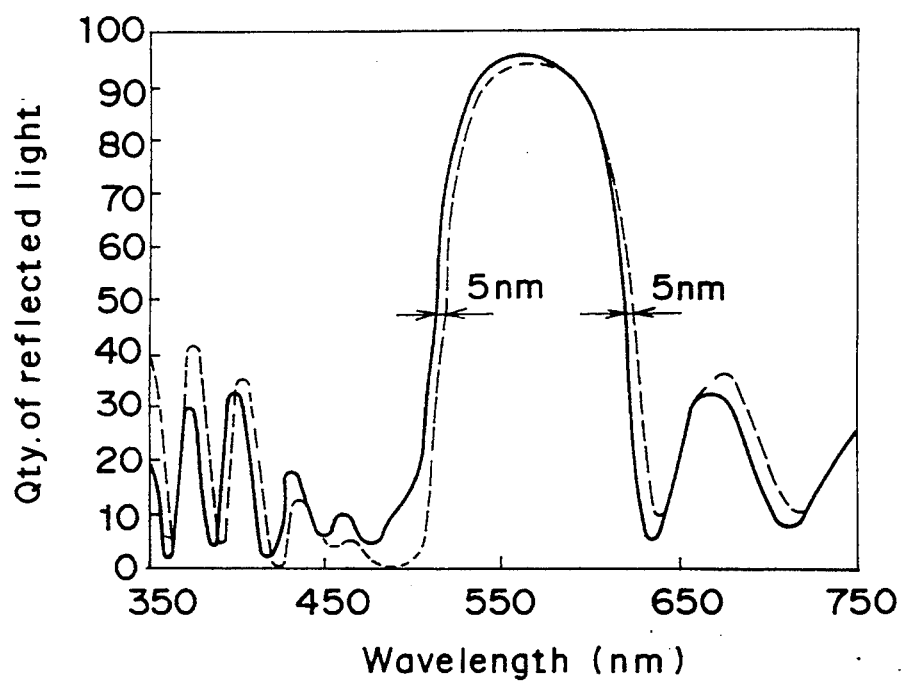
FIG. 5 is a graph showing optical characteristics of a multi-layer film in which thickness of one layer deviates from a target value.
Figure 6:
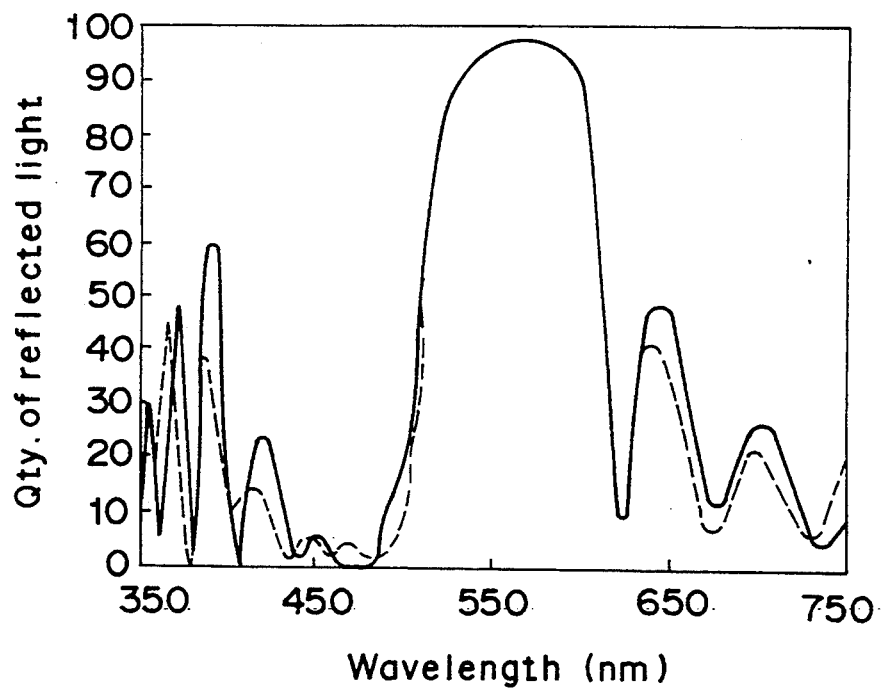
FIG. 6 is a graph showing optical characteristics of a multi-layer film produced by the multi-layer film forming apparatus of FIG. 2, in which the deviation of the thickness of one layer from a target value is corrected.

Hereinbelow, a case is described in which thickness of a thin film of a 14th layer has suddenly been reduced by as much as 10% from unknown causes in the final multi-layer film having 19 layers. Upon formation of this thin film of the 14th layer on the film monitoring substrate 24, the multi-layer film has the spectral characteristics shown in FIG. 5. In FIG. 5, the broken line represents the target value, while the solid line represents the measured value. In FIG. 5, the half-wavelength of measured value of the solid line deviates by about 5 nm from that of the target value of the broken line leftwards. Thus, it is anticipated that even if the subsequent layers are formed as per predetermined thicknesses, the optical characteristics of the final multi-layer film having 19 layers will deviate from target optical characteristics. Therefore, a deviation of 5 nm is corrected by using thicknesses of the remaining 15th to 19th layers and thus, the final multi-layer film having 19 layers have the optical characteristics shown in FIG. 6. In FIG. 6, the solid line represents the target optical characteristics, while the broken line represents the corrected optical characteristics. FIG. 6 shows that corrected optical characteristics of the broken line approximate the target optical characteristics of the solid line substantially and are quite excellent.

As described above, even if the thickness of one layer of the multi-layer film deviates from a target value, the deviation of the thickness of the one layer from the target value is corrected by using thicknesses of the subsequent layers such that optical characteristics of the final multi-layer film approximate the target optical characteristics. Therefore, in accordance with the present invention, excellent optical characteristics of the final multi-layer film can be obtained, thereby resulting in great advantage for its mass production.

In the apparatus K1 of FIG. 2, since the multi-layer film is formed on the substrate 17 by rotating the substrate holder 16, it is unavoidable to provide the film monitoring substrate 24 only at a central portion of the substrate holder 16. Hence, the area of the substrate holder 16, in which the substrates 17 can be provided, may be reduced.

Meanwhile, in the apparatus K1, a pair of mirrors are additionally provided for causing light to be incident upon the film monitoring substrate 24 and guiding to the optical characteristics evaluator 25 reflected light from the film monitoring substrate 24. As a result, a complicated optical system for the mirrors also to must be additionally provided.

Furthermore, in the apparatus K1, since the thickness monitoring substrate 19 and the film monitoring substrate 24 deviate in position from each other, the thickness of a layer formed on the thickness monitoring substrate 19 may become minutely different from that of the film monitoring substrate 24.

Figure 7:
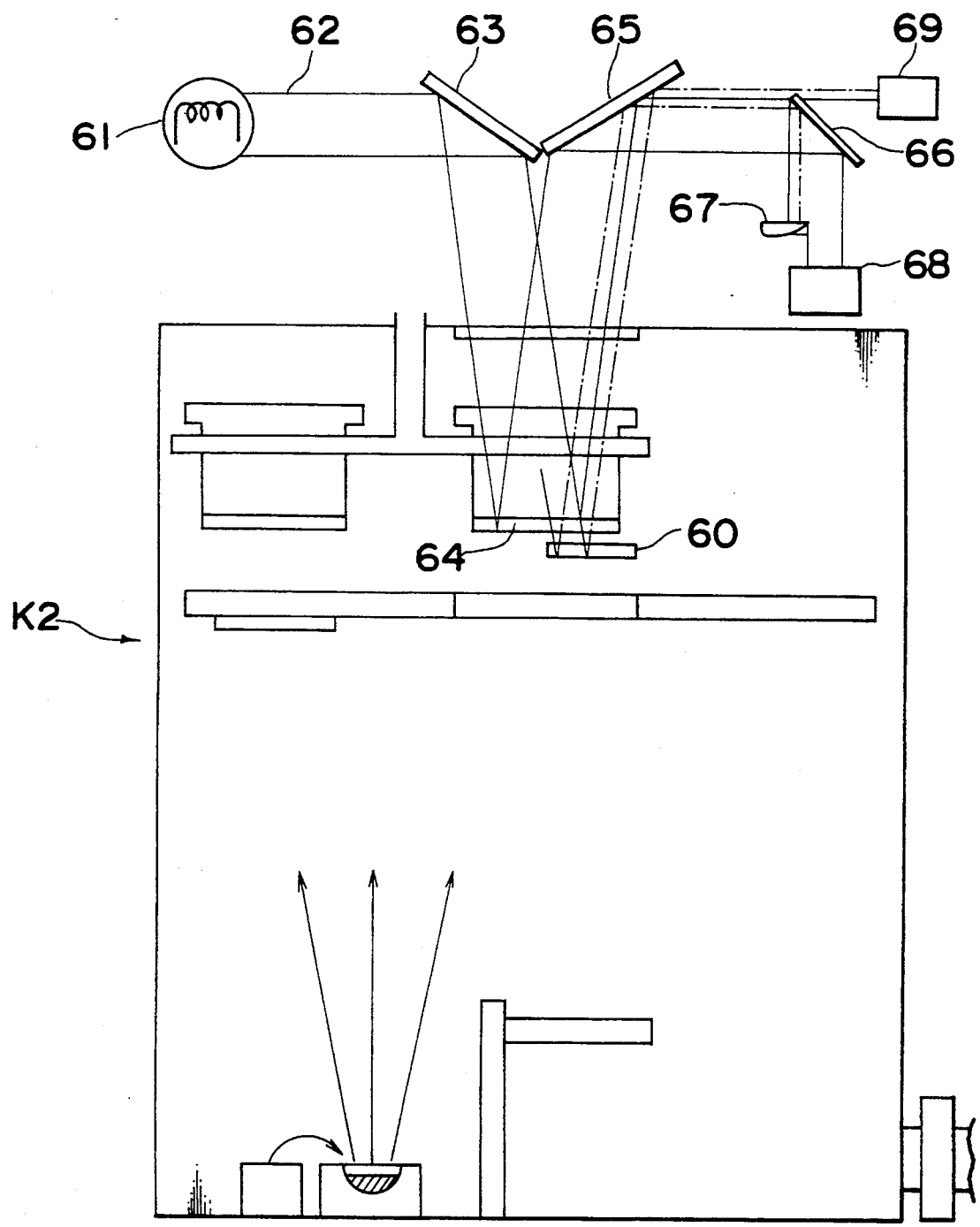
FIG. 7 is a schematic view of a multi-layer film forming apparatus according to a second embodiment of the present invention.
Figure 8A:
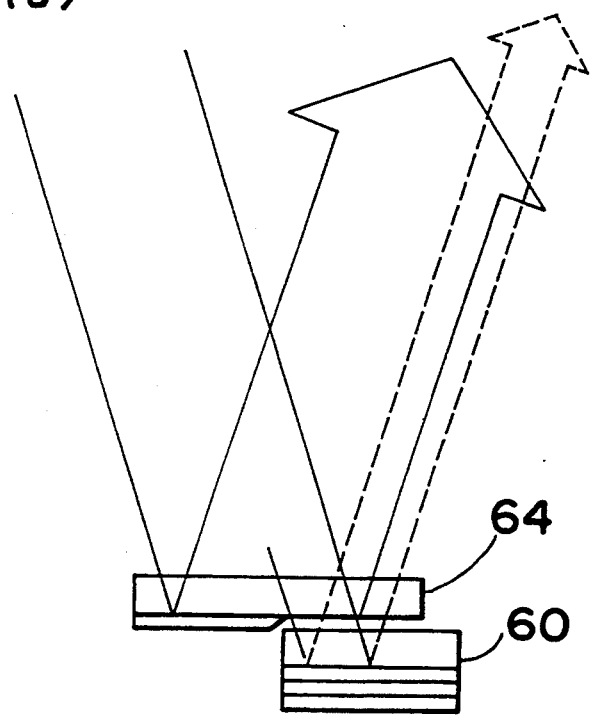
FIGS. 8(a) and 8(b) are schematic side elevational and top plan views of a multi-layer film monitoring substrate employed in the multi-layer film forming apparatus of FIG. 7, respectively.
Figure 8B:
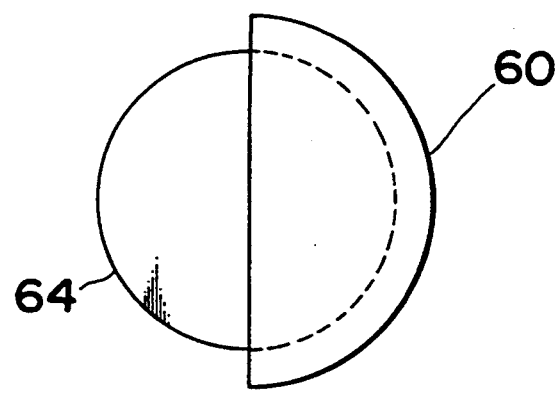

In order to further improve the above described arrangement of the apparatus K1, a multi-layer film forming apparatus K2 according to a second embodiment of the present invention is provided as shown in FIG. 7. In the apparatus K2, a multi-layer film monitoring substrate 60 is provided below an optical film thickness monitoring substrate 64. As shown in FIGS. 8(a) and 8(b), the film monitoring substrate 60 is formed by a semicircular glass member and overlaps an approximately half portion of the thickness monitoring substrate 64. The film monitoring substrate 60, needless to say, may also have a rectangular shape.

Hereinbelow, an optical system for measuring the spectral characteristics of the multi-layer film by using the film monitoring substrate 60 in the apparatus K2 is described. A bundle of rays 62 emitted from a light source 61 is caused to be incident upon the film monitoring substrate 64 by a mirror 63. A portion of incident light is reflected by the thickness monitoring substrate 64 and then, proceeds to a detector 68 via mirrors 65 and 66 through shielding of a portion of reflected light from the thickness monitoring substrate 64 by a light shielding plate 67. A portion of reflected light from the thickness monitoring substrate 64 is shielded by the light shielding plate 67 for the purpose of excluding reflected light from the film monitoring substrate 60.

Meanwhile, light which has passed through the thickness monitoring substrate 64 is reflected by the multi-layer film formed on the film monitoring substrate 60 and again passes through the thickness monitoring substrate 64 so as to proceed to an optical characteristics evaluator 69 through the mirror 65. At this time, the reflected light from the thickness monitoring substrate 64 is shielded by the mirror 66 such that only reflected light from the film monitoring substrate 60 is detected by the optical characteristics evaluator 69.

Since other constructions of the apparatus K2 are similar to those of the apparatus K1, a description thereof has been abbreviated for the sake of brevity.

By using the optical system of the apparatus K2, the additional optical system for guiding light to the film monitoring substrate 24 in the apparatus K1 can be eliminated. Therefore, by merely providing the film monitoring substrate 60 below the thickness monitoring substrate 64, the spectral characteristics of the multi-layer film can be measured easily, which is quite advantageous for practical use.

Furthermore, in the apparatus K2, since the film monitoring substrate 60 is provided below the thickness monitoring substrate 64, a reduction of in the area of the substrate holder, in which the substrates can be provided, and minute difference between the thickness of a layer formed on the film monitoring substrate 60 and that of the thickness monitoring substrate 64 can be eliminated advantageously for practical use.

Figure 9:
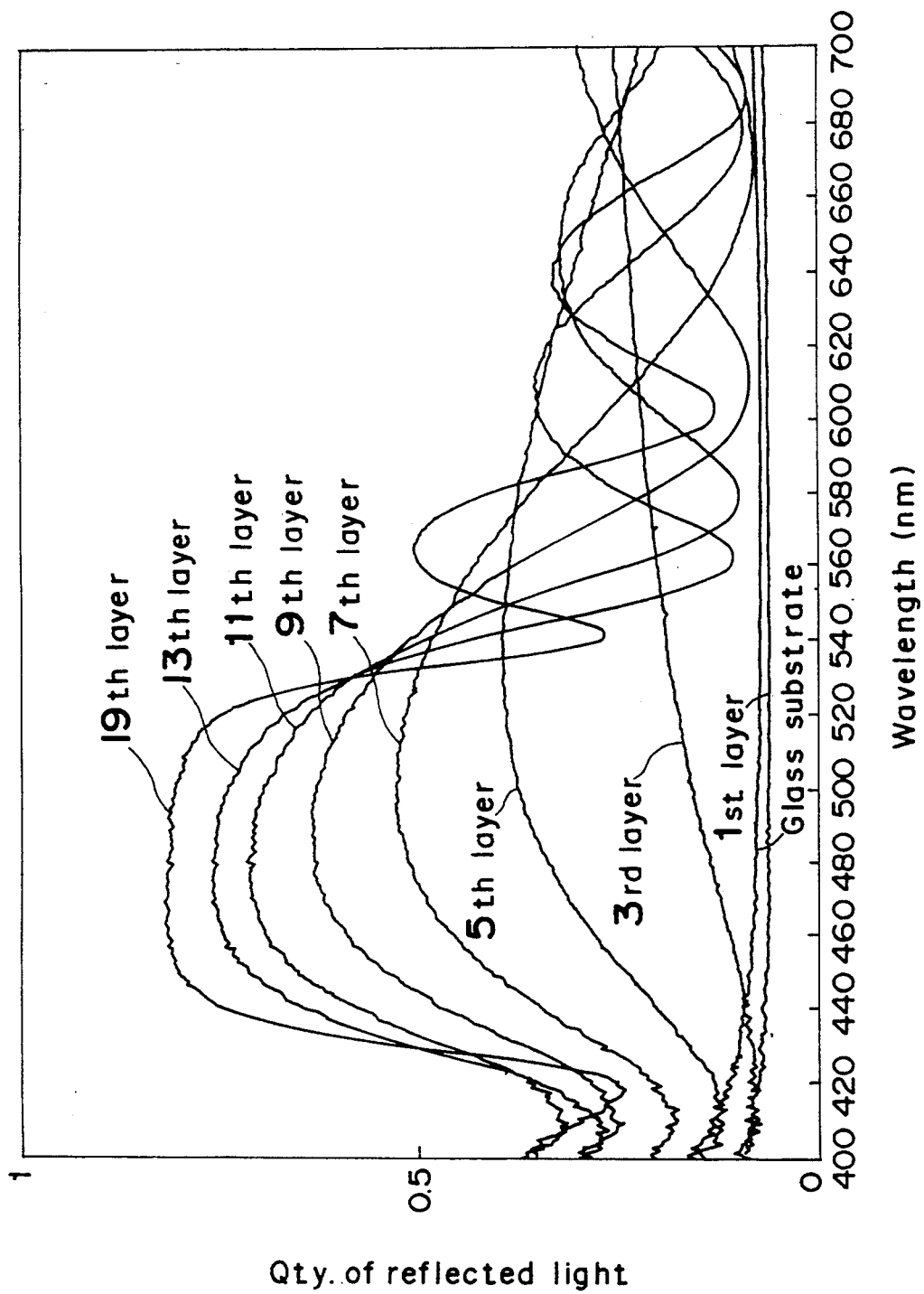
FIG. 9 is a graph showing optical characteristics of a multi-layer film produced by the multi-layer film forming apparatus of FIG. 7.

When a multi-layer film having 19 layers in which a film of $TiO_2$ has a thickness of about 100 nm and a film of $SiO_2$ has a thickness of 40 nm are formed on the film monitoring substrate 60 by the apparatus K2 through control of optical film thickness, the multi-layer film has spectral characteristics shown in FIG. 9. In the graph of FIG. 9, the abscissa represents the wavelength expressed in nm, while the ordinate represents the amount of reflected light expressed in arbitrary units. It is apparent from FIG. 9 that a multi-layer film having a higher refractive index is obtained as the number of layers is increased.

Accordingly, if the multi-layer film is formed by the apparatus K2, the spectral characteristics of the multi-layer film can be measured simultaneously with the control of optical film thickness easily, which is quite advantageous for practical use.

In the apparatus K2, the mirror 66 and the light shielding plate 67 are provided for cancelling an overlap portion between reflected light from the film monitoring substrate 60 and reflected light from the thickness monitoring substrate 64. Even if the mirror 66 and the light shielding plate 67 are adjusted, for example, immediately prior to formation of the multi-layer film by using the thickness monitoring substrate 60 and the film monitoring substrate 64, such an undesirable phenomenon may take place that when the film monitoring substrate 60 or the thickness monitoring substrate 64 is inclined only slightly due to vibrations during formation of the multi-layer film, light from the thickness monitoring substrate 64 will be incident upon the optical characteristics evaluator 69 or light from the film monitoring substrate 60 will be incident upon the detector 68, so that an excellent optical measurement cannot be performed.

Figure 10:
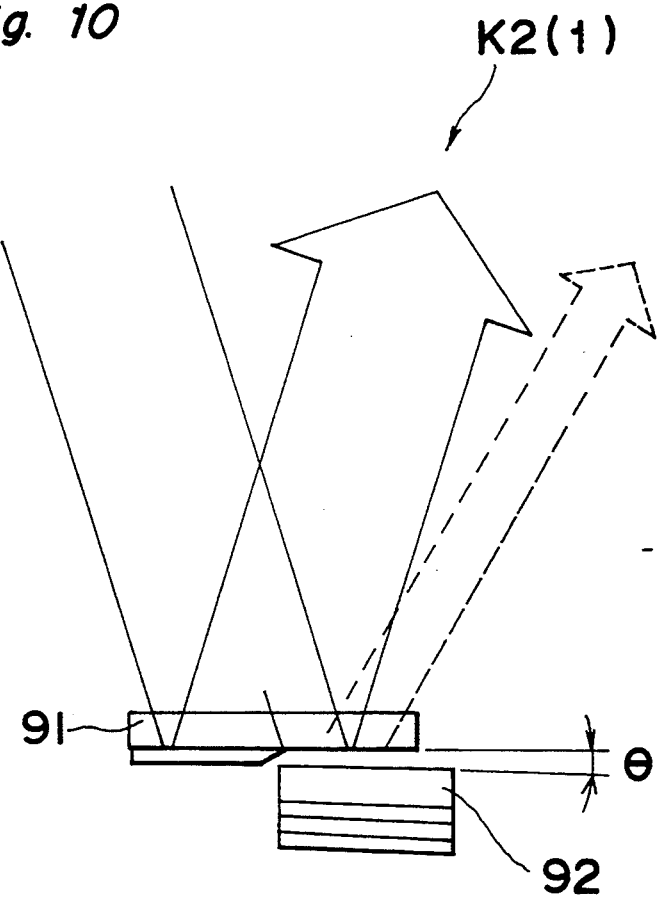
FIG. 10 is a view similar to FIG. 8(a), particularly showing a first modification thereof.

In order to eliminate the above described possibility in the apparatus K2, a multi-layer film forming apparatus K2(1) which is a first modification of the apparatus K2 is provided as shown in FIG. 10. In FIG. 10, a multi-layer film monitoring substrate 92 is inclined through an angle $\theta$ relative to an optical film thickness monitoring substrate 91. Therefore, reflected light from the thickness monitoring substrate 91 and reflected light from the film monitoring substrate 92 angularly deviate from each other and thus, a region having no overlap between reflected light from the thickness monitoring substrate 91 and reflected light from the film monitoring substrate 92 can be obtained. Accordingly, if reflected light from the thickness monitoring substrate 91 and reflected light from the film monitoring substrate 92 are separated and measured in this region, reflected light from the thickness monitoring substrate 91 and reflected light from the film monitoring substrate 92 can be separated and detected efficiently.

Generally, since the optical characteristics evaluator 69 and the detector 68 are spaced about 100 cm from the film monitoring substrate 92 and the thickness monitoring substrate 91, respectively, a gap of about 3 mm which is sufficiently large for separating reflected light from the film monitoring substrate 92 and reflected light from the thickness monitoring substrate 91 is defined therebetween. Meanwhile, since the film monitoring substrate 92 is inclined relative to the thickness monitoring substrate 91, the thickness of one layer formed on the thickness monitoring substrate 91 becomes different from that of the film monitoring substrate 92. However, if the angle $\theta$ is set to 1°, the difference in film thickness is assumed to be merely about 0.02% or less, which offers no problem for practical use.

Accordingly, in the apparatus K2(1), if the film monitoring substrate 92 is inclined through an angle $\theta$ of 0.2° to 1° relative to the thickness monitoring substrate 91, the reflected light from the thickness monitoring substrate 91 and the reflected light from the film monitoring substrate 92 can be separated from each other easily.

Figure 11:
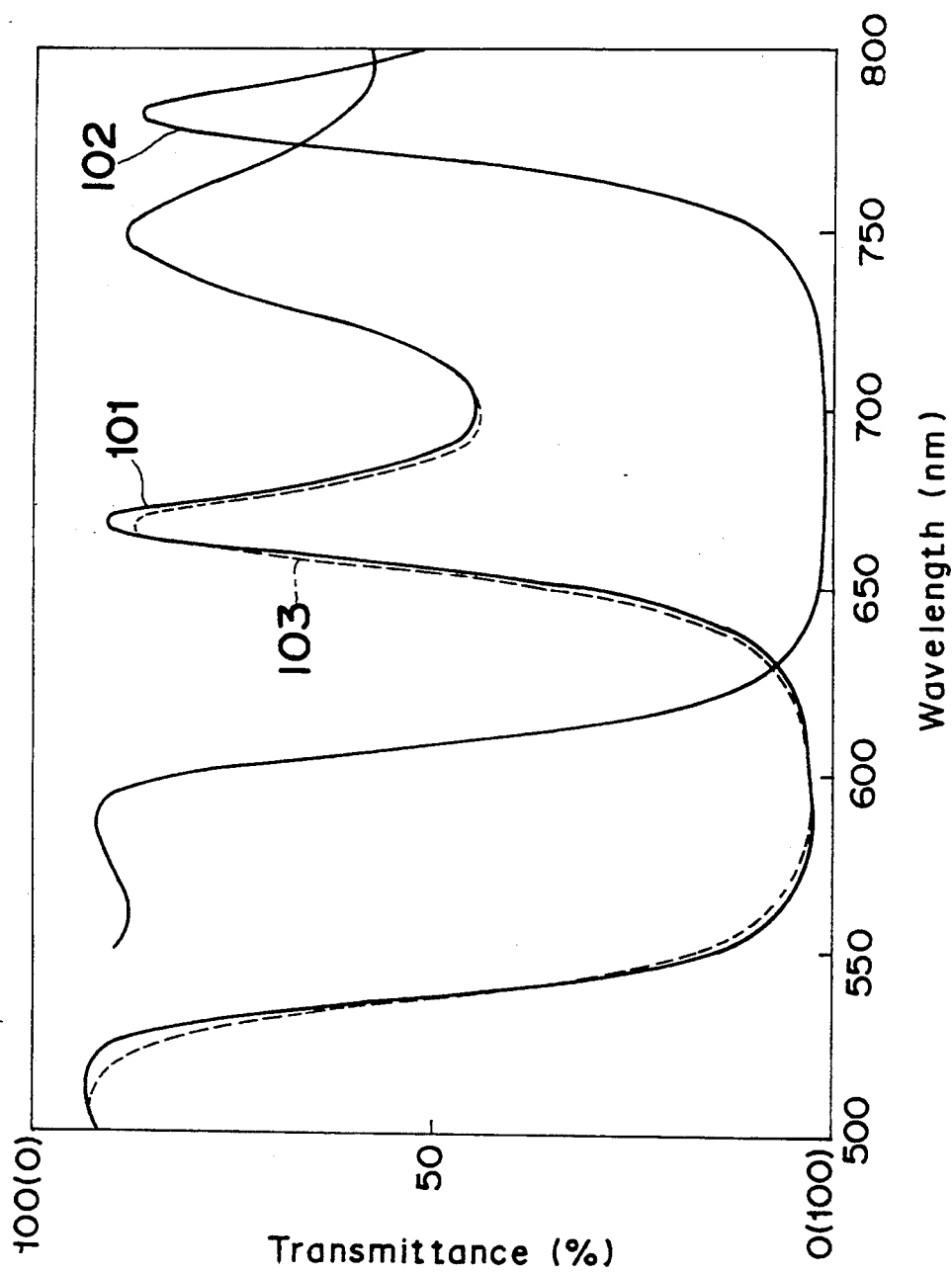
FIG. 11 is a graph showing optical characteristics of a multi-layer film produced by the multi-layer film forming apparatus of FIG. 7.
Figure 12:
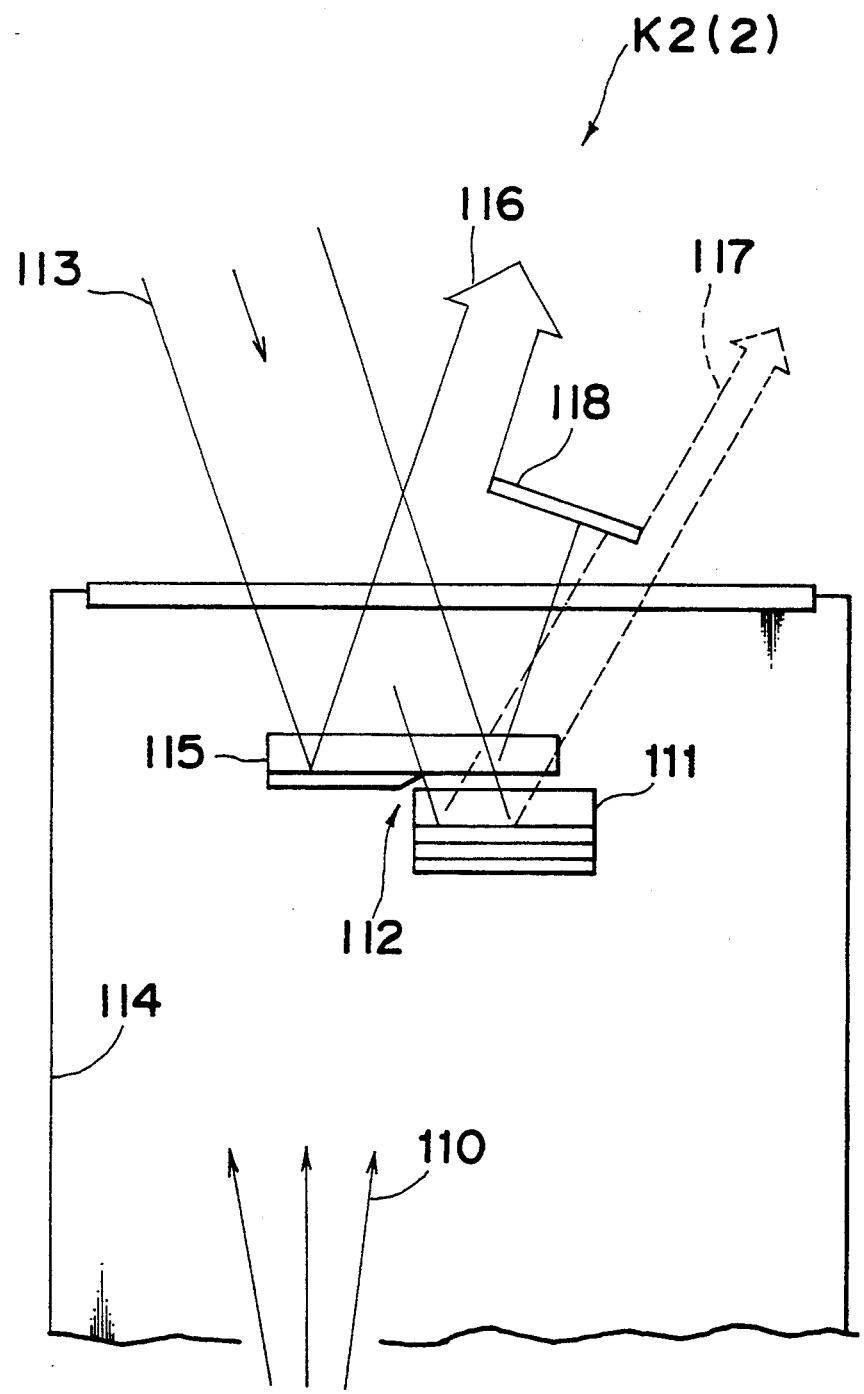
FIG. 12 is a schematic view of a multi-layer film forming apparatus which is a second modification of the multi-layer film forming apparatus of FIG. 7.

In the apparatus K2, such a phenomenon as shown in FIG. 11 may take place. In FIG. 11, the curve 101 shows the spectral characteristics of the multi-layer film formed by a prior art multi-layer forming apparatus in which the film monitoring substrate 60 is not provided, while the curve 102 shows spectral characteristics of the multi-layer film formed at the same optical film thickness as that of the curve 101 by the apparatus K2 provided with the film monitoring substrate 60. The curve 102 greatly deviates rightwards due to a large difference of optical film thickness of the multi-layer film from the target optical film thickness. The present inventors have found that this phenomenon is caused by the fact that an edge portion of the thin film formed on the thickness monitoring substrate, which confronts an outer peripheral portion of the film monitoring substrate, becomes quite thin, namely, a wane of the thickness of the thin film on the thickness monitoring substrate. Namely, as shown in FIG. 12, when a thin film is formed on an optical film thickness monitoring substrate 115 by evaporated particles 110, a multi-layer film monitoring substrate 111 prevents the evaporated particles 110 from reaching the thickness monitoring substrate 115 and thus, a portion of the thin film adhering to the thickness monitoring substrate 115 becomes thin as a waning thickness portion 112. Therefore, the thin film on the thickness monitoring substrate 115 includes the waning thickness portion 112 and the remaining normal thickness portion having a predetermined thickness. Since light is irradiated also to this waning film thickness portion 112, both reflected light from the normal thickness portion and reflected light from the waning thickness portion 112 are used for measurement.

In order to obtain the multi-layer film having the target optical film thickness at high reproducibility by shielding reflected light from the waning thickness portion 112, a multi-layer film forming apparatus K2(2) which is a second modification of the apparatus K2 is provided as shown in FIG. 12. In the apparatus K2(2), the thickness monitoring substrate 115 and the film monitoring substrate 111 are provided in a vacuum chamber 114. Light 113 is irradiated to the thickness monitoring substrate 115 and the film monitoring substrate 111 so as to be reflected as reflected light 116 and reflected light 117, respectively. In order to shield reflected light from the waning thickness portion 112 of the thin film on the thickness monitoring substrate 115, a light shielding plate 118 is provided. As a result, it is possible to obtain high-quality light from which unnecessary light from the waning thickness portion 112 of the thin film on the thickness monitoring substrate 115 has been cancelled.

Meanwhile, in the apparatus K2(2), not only the reflected light 116 from the thickness monitoring substrate 116 but the reflected light 117 from the film monitoring substrate 111 is shielded by the light shielding plate 118. This is because the reflected light 117 from the film monitoring substrate 111 includes an unnecessary light portion, which has passed through the waning thickness portion 112 and is reflected by the film monitoring substrate 111.

In the apparatus K2(2), since the light shielding plate 118 is provided, spectral characteristics 103 identical with the spectral characteristics 101 in which the film monitoring substrate 111 is not provided can be obtained as shown in FIG. 11 and thus, the multi-layer film has the target optical film thickness.

Figure 13:
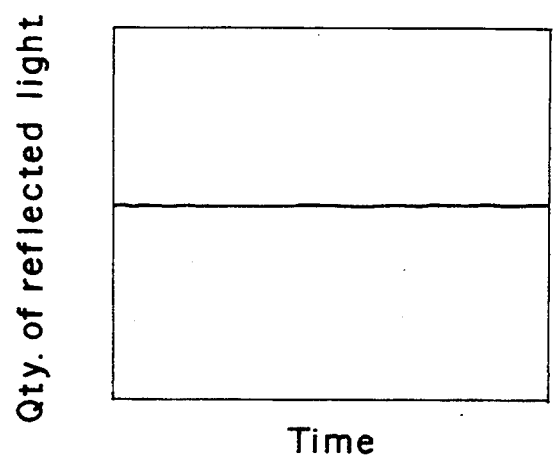
FIG. 13 is a graph showing the change in the quantity of reflected light with time at normal temperature in the multi-layer film forming apparatus of FIG. 7.

When the multi-layer film is formed by the apparatus K2 by setting the substrate to normal temperature, the signal of detection of the reflected light from the thickness monitoring substrate 64 by the detector 68 contains substantially no noise as shown in FIG. 13. However, when the multi-layer film is formed by the apparatus K2 by heating the substrate to high temperatures of 200° to 300° C., noise in the above signal increase considerably. At this time, since an optical window 134 of FIG. 14 is heated to rather high temperatures, air above the optical window 134 is heated by the optical window 134 so as to fluctuate an optical path of reflected light from the thickness monitoring substrate 64, thereby resulting in production of the noise in the signal.

Figure 14:
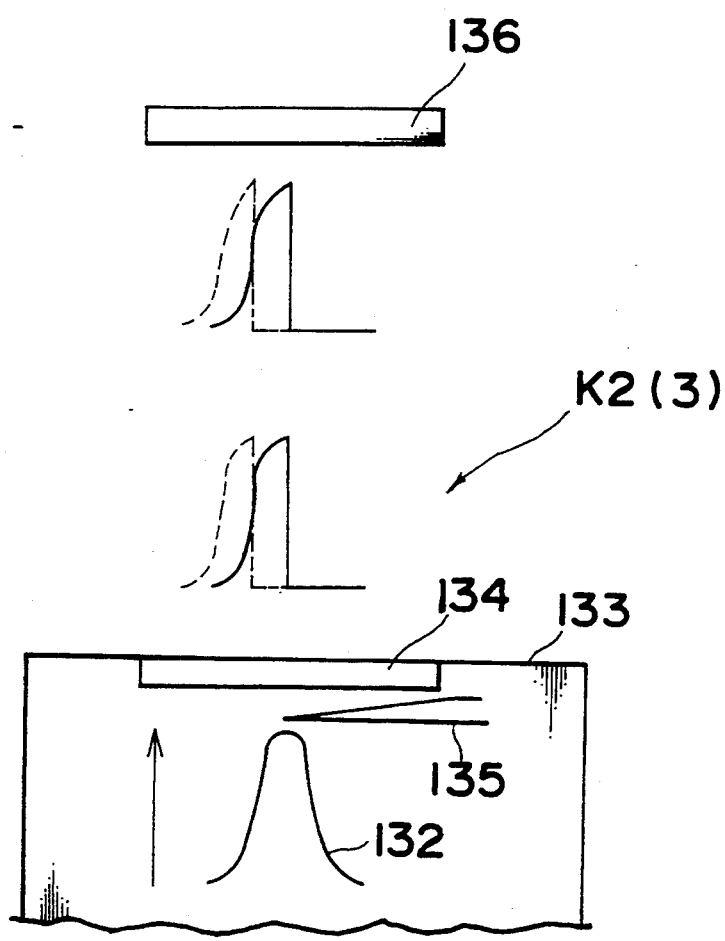
FIG. 14 is a schematic view showing a light shielding plate employed in a multi-layer film forming apparatus which is a third modification of the multi-layer film forming apparatus of FIG. 7.
Figure 15:
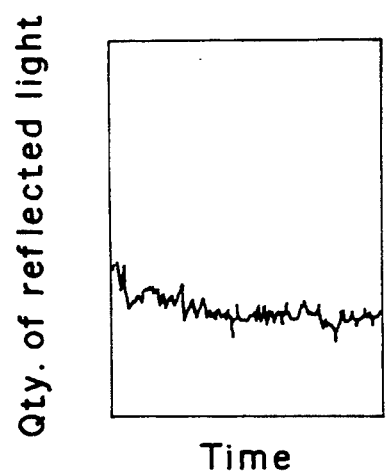
FIG. 15 is a graph showing the change in the quantity of reflected light with time at high temperatures in the multi-layer film forming apparatus of FIG. 14.

In order to prevent such a phenomenon in the apparatus K2, a multi-layer forming apparatus K2(3) which is a third modification of the apparatus K2 is provided as shown in FIG. 14. As shown in FIG. 14, a light shielding plate 135 is disposed in a vacuum chamber 133 in the apparatus K2(3). By this arrangement of the apparatus K2(3), distribution 132 of reflected light from the thickness monitoring substrate 64 is partially shielded by the light shielding plate 134 but does not change after reflected light from the thickness monitoring substrate 64 has been emitted into the atmosphere from the optical window 134. Therefore, the optical power transmitted to a detector 136 does not vary. As a result, even if the multi-layer film is formed by heating the substrate to high temperatures of 200° to 300° C., stable signal can be obtained as shown in FIG. 15.

Figure 16A:
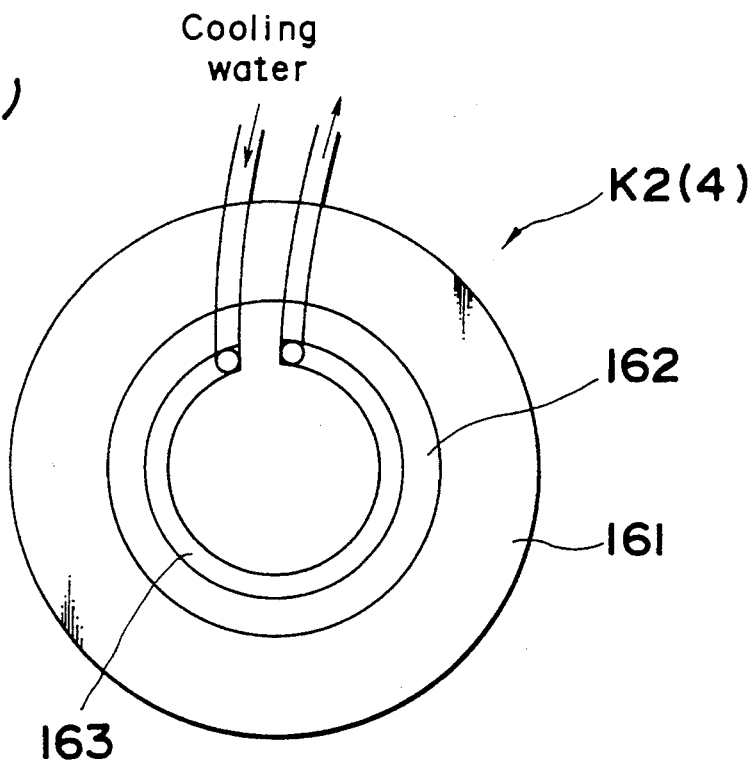
FIGS. 16(a) and 16(b) are a top plan view and a side elevational view of a cooling means employed in a multi-layer film forming apparatus which is a fourth modification of the multi-layer film forming apparatus of FIG. 7.
Figure 16B:
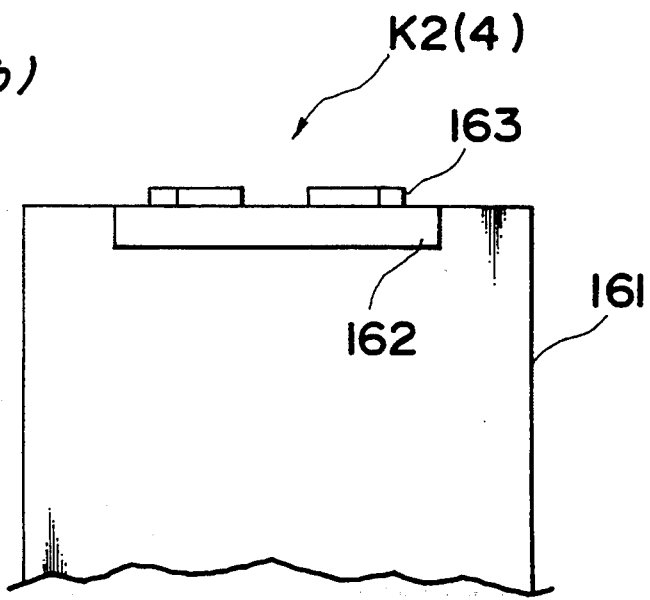
Figure 17:
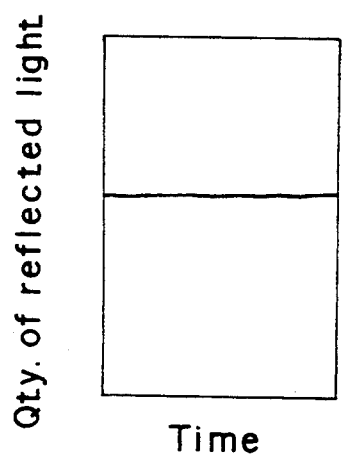
FIG. 17 is a graph showing the change in the quantity of reflected light with time in the multi-layer film forming apparatus of FIG. 16.

In order to further reduce noise in a signal transmitted to the detector 136 in the apparatus K2(3), a multi-layer film forming apparatus K2(4) which is a fourth modification of the apparatus K2 is provided as shown in FIGS. 16(a) and 16(b). Namely, in order to prevent fluctuations of the optical path of reflected light from the thickness monitoring substrate 64 due to heating of the optical window 134 to high temperatures, a cooling tube 163 for cooling an optical window 162 is provided in the apparatus K2(4) such that cooling water is circulated through the cooling tube 162. The cooling tube 162 cools the surface of the optical window 162 so as to reduce fluctuations of air above the optical window 162. When cooling water of about 20° C. is circulated through the cooling tube 163, the surface of the optical window 162 is cooled to as low as about 70° C. and thus, noise in the signal are cancelled substantially as shown in FIG. 17. Signal noise in FIG. 17 is reduced more than that shown in FIG. 15 and have a quality substantially identical with that of a case in which the multi-layer film is formed at normal temperature without the light shielding plate.

In the apparatus K2(4), since the optical window 162 is cooled by the cooling tube 163, fluctuations of air above the optical window 162 are restrained, so that distortion of the optical path of reflected light from the thickness monitoring substrate 64 is lessened considerably and thus, noise in the signal is greatly eliminated.

Accordingly, in the apparatus K2(4), even when the multi-layer film is formed at high temperatures of 200° to 300° C., control of the optical film thickness of the thin film can be performed accurately simultaneously with measurement of spectral characteristics of the multi-layer film.

In accordance with the present invention, the highly accurate multi-layer film can be formed easily at high reproducibility.

What is claimed is:

1. An apparatus for forming a multi-layer film, comprising:
    a vacuum chamber in which the multi-layer film is formed;
    an optical film thickness monitoring substrate on which each of layers of the multi-layer film is formed;
    a replacement means for replacing said optical film thickness monitoring substrate by a new one for each of the layers of the multi-layer film;
    a light source for irradiating light onto said optical film thickness monitoring substrate;
    an optical window for guiding into said vacuum chamber the light emitted from said light source;
    a thickness control means which measures a quantity of reflected light from each of the layers of the multi-layer film formed on said optical film thickness substrate so as to control an optical film thickness of each of the layers of the multi-layer film;
    a multi-layer film monitoring substrate on which the multi-layer film is formed;
    a measurement means for measuring spectral characteristics of the multi-layer film formed on said multi-layer film monitoring substrate; and
    a processing means which processes results obtained by said measurement means so as to feed the processed results back to said thickness control means.

2. An apparatus as claimed in claim 1, wherein said multi-layer film monitoring substrate is disposed below said optical film thickness monitoring substrate.

3. An apparatus as claimed in claim 2, wherein said multi-layer film monitoring substrate is inclined relative to said optical film thickness monitoring substrate.

4. An apparatus as claimed in claim 2, further comprising:
    a light shielding plate for shielding reflected light from a waning thickness portion of each of the layers of the multi-layer film on said optical film thickness monitoring substrate and light which is reflected from the multi-layer film on said multi-layer film monitoring substrate after having passed through the waning thickness portion of each of the layers of the multi-layer film on said optical film thickness monitoring substrate.

5. An apparatus as claimed in claim 4, wherein said light shielding plate is provided in said vacuum chamber.

6. An apparatus as claimed in claim 1, further comprising:
    a cooling means for cooling said optical window.

7. A method of measuring optical characteristics of a multi-layer film, comprising the steps of:
    irradiating a bundle of rays to an optical film thickness monitoring substrate having each of layers of the multi-layer film formed thereon and a multi-layer film monitoring substrate having the multi-layer film formed thereon;
    said multi-layer film monitoring substrate being disposed below said optical film thickness monitoring substrate;
    separating the bundle of rays into a first bundle of rays reflected from each of the layers of the multi-layer film on said optical film thickness monitoring substrate and a second bundle of rays reflected from the multi-layer film on said multi-layer film thickness monitoring substrate; and
    measuring a quantity of reflected light from each of the layers of the multi-layer film by using the first bundle of rays and spectral characteristics of the multi-layer film by using the second bundle of rays.

* * * * *